(12) United States Patent
Ashrafzadeh

(10) Patent No.: US 8,188,541 B2
(45) Date of Patent: May 29, 2012

(54) VERTICAL MOSFET WITH THROUGH-BODY VIA FOR GATE

(75) Inventor: Ahmad Ashrafzadeh, Morgan Hill, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 13/035,842

(22) Filed: Feb. 25, 2011

(65) Prior Publication Data

US 2011/0227153 A1    Sep. 22, 2011

Related U.S. Application Data

(63) Continuation of application No. 12/173,815, filed on Jul. 15, 2008, now Pat. No. 7,910,992.

(51) Int. Cl.
*H01L 29/66* (2006.01)

(52) U.S. Cl. . 257/341; 257/330; 257/621; 257/E29.257; 257/E29.262

(58) Field of Classification Search .................. 257/341, 257/330, 621, E29.257, E29.262
See application file for complete search history.

(56) References Cited

U.S. PATENT DOCUMENTS

| | | | |
|---|---|---|---|
| 4,235,662 A | 11/1980 | Reitz | |
| 5,087,478 A | 2/1992 | Williamson | |
| 6,624,522 B2 | 9/2003 | Standing et al. | |
| 6,930,397 B2 | 8/2005 | Standing et al. | |
| 7,285,866 B2 | 10/2007 | Standing et al. | |
| 7,344,945 B1 | 3/2008 | Pattanayak et al. | |
| 2001/0006831 A1 | 7/2001 | Luo | |
| 2003/0142513 A1* | 7/2003 | Vinciarelli | 363/17 |
| 2004/0036124 A1 | 2/2004 | Vyvoda et al. | |
| 2005/0062101 A1* | 3/2005 | Sugi et al. | 257/330 |
| 2005/0194636 A1 | 9/2005 | Kinzer | |
| 2007/0012996 A1 | 1/2007 | Yoon et al. | |
| 2008/0048174 A1 | 2/2008 | Sadaka et al. | |
| 2009/0224313 A1 | 9/2009 | Burke | |

OTHER PUBLICATIONS

International Search Report dated Aug. 27, 2009 for PCT/US 09/04068. International Filing Date Jul. 14, 2009.

* cited by examiner

*Primary Examiner* — Tu-Tu Ho
(74) *Attorney, Agent, or Firm* — TIPS Group

(57) ABSTRACT

In an embodiment, set forth by way of example and not limitation, a MOSFET power chip includes a first vertical MOSFET and a second vertical MOSFET. The first vertical MOSFET includes a semiconductor body having a first surface defining a source and a second surface defining a drain and a gate structure formed in the semiconductor body near the second surface. A via is formed within the semiconductor body and is substantially perpendicular to the first surface and the second surface. The via has a first end electrically coupled to the first surface and a second end electrically coupled to the gate structure. The second vertical MOSFET includes a semiconductor body having a first surface defining a source, a second surface defining a drain and a gate structure formed in the semiconductor body near the first surface. The first surface of the first vertical MOSFET and the second surface of the second vertical MOSFET are substantially co-planar and an electrically conductive can substantially surrounds the MOSFETS and shorts the first surface of the first vertical MOSFET to the second surface of the second vertical MOSFET.

13 Claims, 4 Drawing Sheets

VERTICAL MOSFET WITH THROUGH-BODY VIA FOR GATE

CROSS REFERENCE TO RELATED APPLICATION

This application is a continuation of U.S. Ser. No. 12/173,815, filed Jul. 15, 2008, which is incorporated herein by reference.

BACKGROUND

A MOSFET (metal-oxide semiconductor field-effect transistor) is a special type of field-effect transistor (FET) that works by electronically varying the width of a channel along which charge carriers flow. The wider the channel, the better the device conducts. The charge carriers enter the channel at a source electrode and exit via a drain electrode. The conductivity of the channel is controlled by the voltage on a gate electrode, which is located physically between the source and the drain and is insulated from the channel by a thin layer of metal oxide.

The 'metal' in the acronym MOSFET is now often a misnomer because the previously metal gate material is now typically a layer of polysilicon (polycrystalline silicon). That is, aluminum was typically used as the gate material until the 1980s when polysilicon became dominant due to its capability to form self-aligned gates. IGFET is a related, more general term meaning insulated-gate field-effect transistor, and is almost synonymous with MOSFET, though it can refer to FETs with a gate insulator that is not oxide. Some prefer to use "IGFET" when referring to devices with polysilicon gates, but most still refer to them as MOSFETs, and that convention will be adopted herein.

There are two ways in which a MOSFET can function. The first is known as depletion mode where when there is no voltage on the gate the channel exhibits its maximum conductance. As the voltage on the gate increases (either positively or negatively, depending on whether the channel is made of P-type or N-type semiconductor material) the channel conductivity decreases. The second way in which a MOSFET can operate is called enhancement mode where when there is no voltage on the gate there is, in effect, no channel and the device does not conduct. A channel is produced by the application of a voltage to the gate. The greater the gate voltage, the better the device conducts.

The MOSFET has certain advantages over the conventional junction FET, or JFET. Because the gate is insulated electrically from the channel, no current flows between the gate and the channel, no matter what the gate voltage (as long as it does not become so great that it causes physical breakdown of the metallic oxide layer). Thus, the MOSFET has practically infinite impedance. This makes MOSFETs useful for power applications. The devices are also well suited to high-speed switching applications.

A power MOSFET is a specific type of MOSFET designed to handle large power. Compared to the other power semiconductor devices (e.g. Isolated Gate Bipolar Transistors ("IGBTs"), thyristors, etc.) its main advantages are high commutation speed, good efficiency at low voltages and an isolated gate that makes it easy to drive. The power MOSFET shares its operating principles with its low-power counterpart, the lateral MOSFET. The power MOSFET is the most widely used low-voltage (i.e. less than 200 V) switch. It can be found in most power supplies, DC-to-DC converters and low voltage motor controllers.

FIG. 1 is a cross section of a prior art. Vertical Diffused Metal Oxide Semiconductor (VDMOS) showing an elementary cell. Cells are typically very small (some micrometers to some tens of micrometers wide) and a power MOSFET is typically composed of several thousand of them. The cross section illustrates the "verticality" of the device where the source electrode is located over the drain, resulting in a current mainly in the vertical direction when the transistor is in the on-state. As used herein, a "vertical MOSFET" and a "power MOSFET" will be used interchangeably. The "diffusion" in VDMOS refers to the manufacturing process: the P wells are obtained by a double diffusion process for the P and $N^+$ regions.

It should be noted that there are many types and designs of power MOSFETs and that the example MOSFET of FIG. 1 is simply one of many. FIG. 2 illustrates, in schematic form, a generalized power MOSFET 9. A semiconductor body B, typically silicon, has a source S on one side and a drain D on the other side. A gate G is provided on the source S side. The gate G is, of course, insulated from the body B and is connected to the gates of the typically thousands of MOSFET cells. Likewise the source S is connected to the sources of the MOSFET cells and the drain D is connected to the drains of the MOSFET cells.

A buck regulator is a DC-to-DC switching converter topology that takes an unregulated input voltage and produces a lower regulated output voltage. The lower output voltage is achieved by chopping the input voltage with a series connected switch (transistor) which applies pulses to an averaging inductor and capacitor. In a MOSFET buck regulator two MOSFETS are used where the drain for a "low side" MOSFET and source of a "high side" MOSFET are connect together.

FIG. 3 is a schematic of a prior art MOSFET circuit 10 useful for buck regulators. The circuit 10 includes a first MOSFET 12 and a second MOSFET 14 connected in series. That is, source S of the first MOSFET 12 is coupled to the drain D of second MOSFET 14 forming a node known as the "phase."

FIG. 4 illustrates a possible physical connection of MOSFETS 12 and 14 according to the prior art. Since the vertical MOSFETS 12 and 14 have their drains on the back side of the silicon both of these MOSFETS cannot be in contact with same conductive surface or "plate" since this would short their drains. This requires the drains to be attached to two separate plates, P1 and P2, respectively, which are electrically isolated from each other. Multi-bond wires 20 couple the source S of MOSFET 12 to the drain D of MOSFET 14. Therefore the plate P2 serves as the phase in this example.

The packaging of semiconductors is becoming increasingly important. Packaging can be used to optimize semiconductor performance in many ways including heat dissipation, shielding and interconnect simplification. For example, Standing et al, in U.S. Pat. Nos. 6,624,522, 6,930,397 and 7,285,866, incorporated herein by reference, teaches packages well suited for MOSFETs. Standing's devices includes a metal can which is receptive to a MOSFET. The MOSFET is oriented such that its drain electrode is facing the bottom of the can and is electrically connected to the same by a layer of conductive epoxy, a solder or the like. The edges of the MOSFET are spaced from the walls of the can and the space between the edges of the MOSFET and the walls of the can is filled with an insulating layer.

FIG. 5 illustrates a can-type package for a MOSFET in accordance with the prior art. The can 16 encloses a power MOSFET 18 with the drain D electrically coupled to the electrically conductive metal can 16. The can package, while advantageous in general, is not well suited for enclosing pairs of power MOSFETs that are interconnected as set forth in FIG. 3. This is because of the aforementioned problem of shorting the drains on a conductive plate, i.e. the bottom of the electrically conductive metal can 16.

These and other limitations of the prior art will become apparent to those of skill in the art upon a reading of the following descriptions and a study of the several figures of the drawing.

SUMMARY

In an embodiment, set forth by way of example and not limitation, a vertical MOSFET includes a semiconductor body having a substantially planar first surface defining a source and a substantially planar second surface defining a drain. The first surface and the second surface are substantially parallel and are not co-planar. A gate formed in the semiconductor body proximate the second surface is coupled to a via formed within the semiconductor body at least partially between the first surface and the second surface.

In an embodiment, set forth by way of example and not limitation, a MOSFET power chip includes a first vertical MOSFET and a second vertical MOSFET. The first vertical MOSFET includes a semiconductor body having a first surface defining a source and a second surface defining a drain. A gate structure is formed in the semiconductor body near the second surface, and a via is located within the semiconductor body which is substantially perpendicular to the first surface and the second surface. The via has a first end electrically coupled to the first surface and a second end electrically coupled to the gate structure.

The second vertical MOSFET includes a semiconductor body having a first surface defining a source and a second surface defining a drain and a gate structure formed in the semiconductor body near the first surface. The first surface of the first vertical MOSFET and the second surface of the second vertical MOSFET are substantially co-planar and an electrically conductive material couples the first surface of the first vertical MOSFET to the second surface of the second vertical MOSFET.

In an embodiment, set forth by way of example and not limitation, a MOSFET power chip includes a first vertical MOSFET and a second vertical MOSFET. The first vertical MOSFET includes a semiconductor body having a first surface defining a source and a second surface defining a drain and a gate structure formed in the semiconductor body near the second surface. A via is formed within the semiconductor body and is substantially perpendicular to the first surface and the second surface. The via has a first end electrically coupled to the first surface and a second end electrically coupled to the gate structure.

The second vertical MOSFET includes a semiconductor body having a first surface defining a source, a second surface defining a drain and a gate structure formed in the semiconductor body near the first surface. The first surface of the first vertical MOSFET and the second surface of the second vertical MOSFET are substantially co-planar and an electrically conductive can substantially surrounds the MOSFETS and shorts the first surface of the first vertical MOSFET to the second surface of the second vertical MOSFET.

In an embodiment, set forth by way of example and not limitation, a power switching device includes a semiconductor body having a first surface and a second surface and a vertical semiconductor structure formed therebetween. A control node for the vertical semiconductor structure would normally be associated with the first surface in traditional designs but, instead, a via extending within the semiconductor body between the first surface and the second surface associates the control node with the second surface.

By using a through-body via the gate can be brought out from the back making it possible to "flip" the die relative to the conventional MOSFET to short the source of the die with the drain of the conventional MOSFET. This simplifies the package, allowing for better connection between the dice and therefore overall better performance.

These and other embodiments and advantages and other features disclosed herein will become apparent to those of skill in the art upon a reading of the following descriptions and a study of the several figures of the drawing.

BRIEF DESCRIPTION OF THE DRAWINGS

Several exemplary embodiments will now be described with reference to the drawings, wherein like components are provided with like reference numerals. The exemplary embodiments are intended to illustrate, but not to limit. The drawings include the following figures.

DETAILED DESCRIPTION OF EXEMPLARY EMBODIMENTS

FIGS. 1-5 were discussed with respect to the prior art. FIGS. 6-9 illustrate several embodiments by way of example and not limitation.

Figure 1:
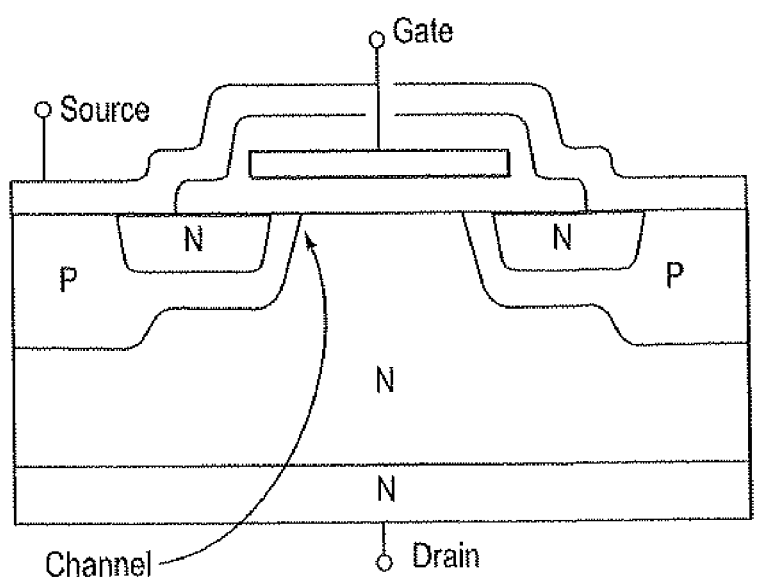
FIG. 1 is a cross-section of an example vertical MOSFET cell of the prior art.
Figure 2:
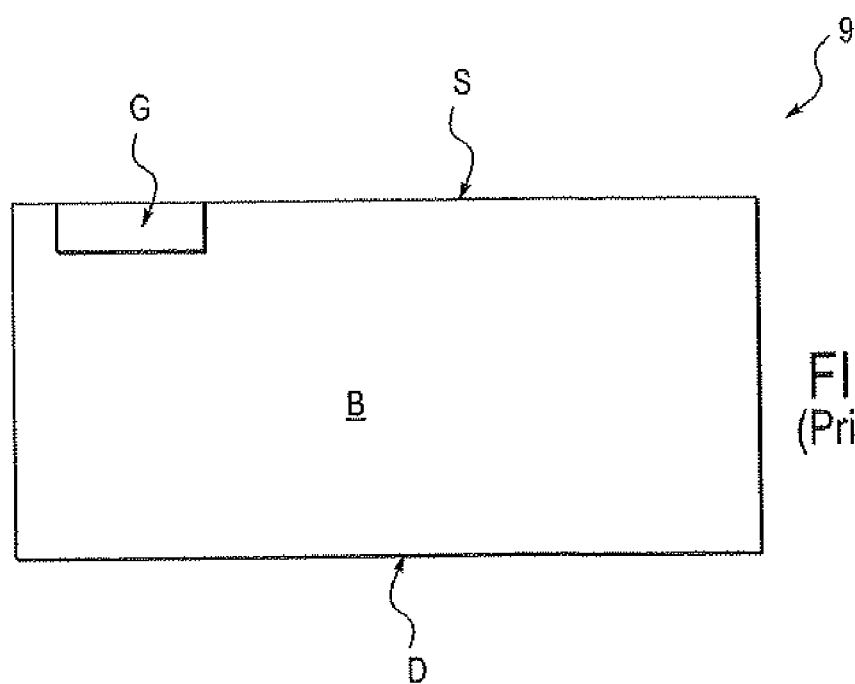
FIG. 2 is a simplified representation of a vertical MOSFET of the prior art.
Figure 3:
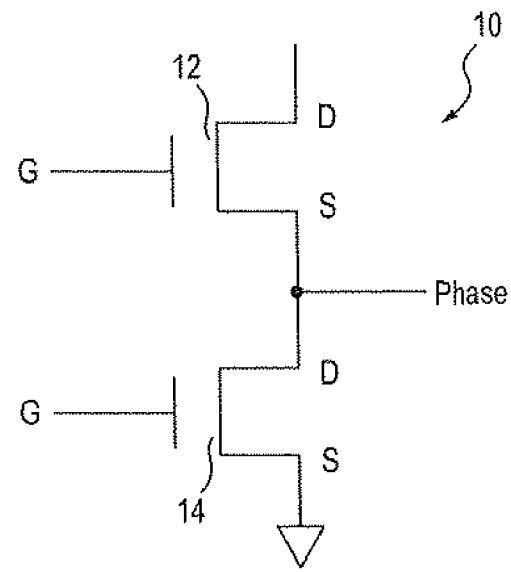
FIG. 3 is a schematic diagram of a pair of vertical MOSFETs coupled together in accordance with the prior art.
Figure 4:
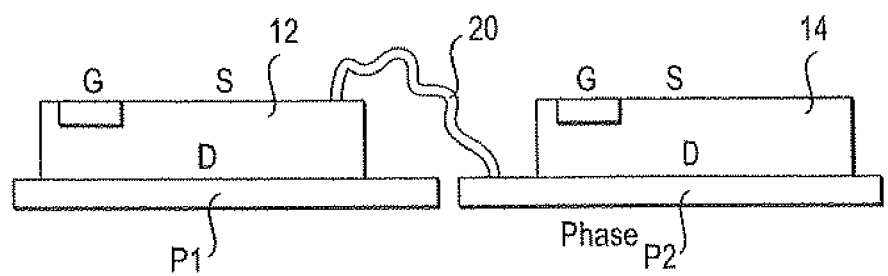
FIG. 4 is an illustration of the physical interconnection of the MOSFETs of FIG. 3.
Figure 5:
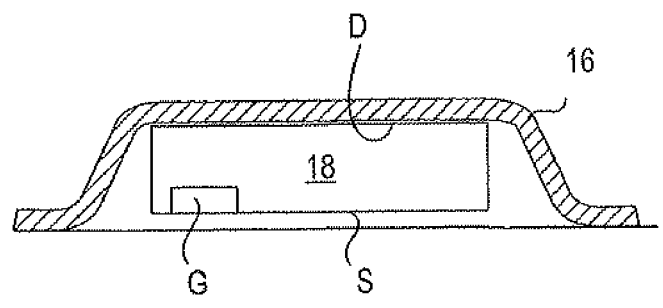
FIG. 5 is an illustration of a can-type package for a vertical MOSFET of the prior art.
Figure 6:
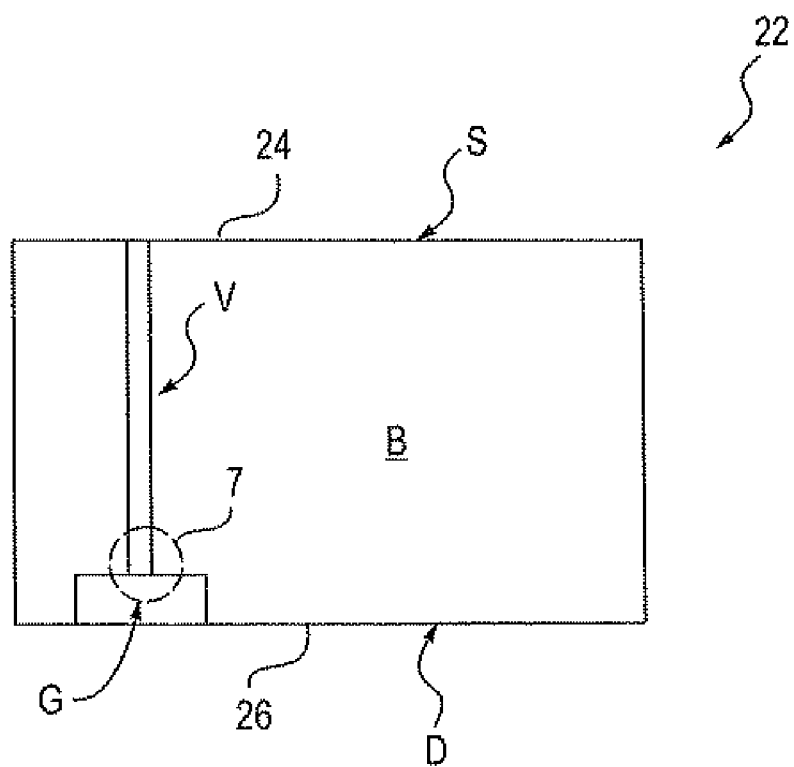
FIG. 6 is a simplified representation of a vertical MOSFET with through-body via for the gate.

In FIG. 6, a vertical MOSFET 22 in accordance with an embodiment has a body B including a semiconductor material such as silicon or gallium arsenide. The body B is often a piece, known as a "die", of a semiconductor wafer. Multiple die are referred to as "dice." The body B can be substantially mono-crystalline or can be made of multiple formed layers.

As in the prior art, the vertical MOSFET 22 is made from many MOSFET cells where the drains, sources and gates are coupled together to form the drain D, source S and gate G of the vertical MOSFET 22. There are many designs for vertical MOSFETS and MOSFET cells, as is well known to those of skill in the art. See, for example, without limitation, *POWER MOSFET DESIGN*, by B. E. Taylor, John Wiley & Sons, Inc., 1993, incorporated herein by reference.

Vertical MOSFET 22 is provided with a via structure V within the body B and is shown in this example as extending between a first surface 24 associated with source S and gate structure G. A second surface 26 is associated with drain D.

The gate structure G is formed proximate to the drain D rather than the source S (as opposed to the prior art) due to the conductive via structure V.

Figure 7:
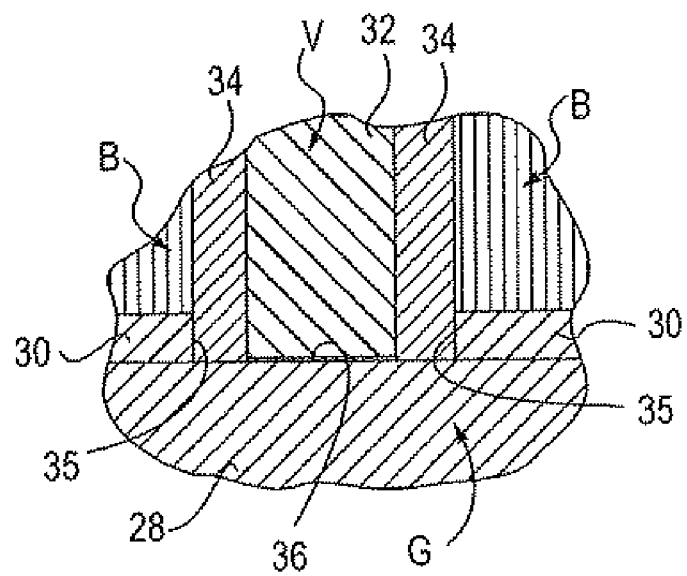
FIG. 7 is an enlarged view of the portion of FIG. 6 encircled by broken line 7.

With additional reference to FIG. 7, which is an enlarged view of the portion of FIG. 6 encircled by broken line 7, the gate G comprises a conductive material 28 which is electrically isolated from the body B by an insulating layer 30. The conductive material 28 can be polysilicon or other conductive material such as a metal, e.g. aluminum. The insulating layer 30 can be of several process-compatible types such as silicon oxide or silicon nitride. The terms "gate" and "gate structure" will be, at times, used somewhat synonymously, although at times "gate" will refer primarily to the conductive portion of the gate while "gate structure" will usually refer to both the conductive portion and the insulating portion of the gate.

The via structure V includes a conductive material 32 which is typically a metal such as tungsten, aluminum, copper, etc. The via structure V further includes an insulating layer 34 which electrically isolates the conductive material 32 from the body B. The terms "via" and "via structure" will be, at times, used somewhat synonymously, although at times "via" will refer primarily to the conductive portion of the via while "via structure" will usually refer to both the conductive portion and the insulating portion of the via.

The formation of vias in semiconductor wafers is well known to those of skill in the art. See, for example, *Handbook of Semiconductor Manufacturing Technology, Second Edition*, by Robert Doering (Editor) and Yoshio Nishi (Editor), CRC, 2$^{nd}$ Edition 2007, incorporated herein by reference. Via holes may be created in the wafers by a number of methods well known to those skilled in the art including anisotropic plasma etching, laser drilling, etc.

The illustration of FIG. 7 is by way of example only, and not limitation. The conductive material 32 of the via V is shown to abut the conductive material 28 of gate G at an interface 36. However, the conductive materials can be coupled together by intermediate materials, be fused together, be formed as a continuous material, etc. Likewise the insulating material 30 of the gate G and the insulating material 34 of the via V are shown to be abutting at an interface 35. However, these insulating materials can likewise be coupled together by other insulating materials, be fused together, be formed as a continuous material, etc.

Figure 8:
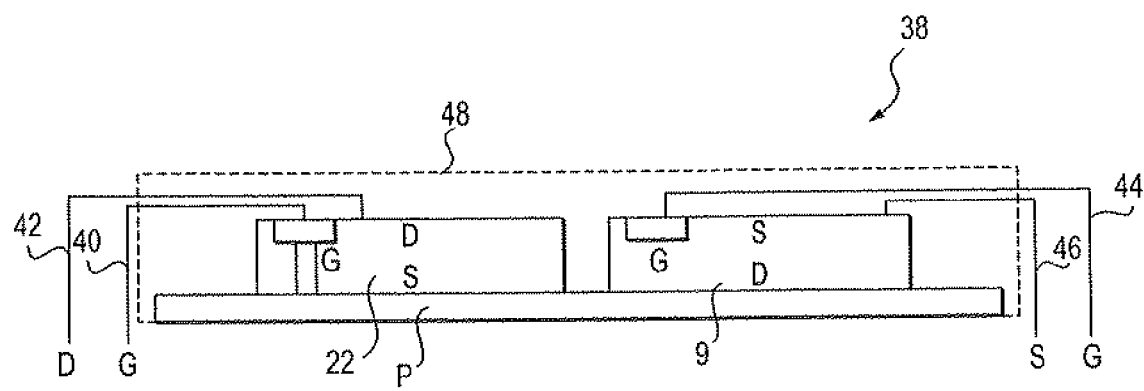
FIG. 8 is an illustration of an example physical connection of a conventional vertical MOSFET with a MOSFET of FIG. 6.

FIG. 8 illustrates an embodiment of a MOSFET power chip 38 by way of example and not limitation. The power chip 38 includes a conventional vertical MOSFET die 9 and a vertical MOSFET die 22 as described above. The source of MOSFET 22 and the drain of MOSFET 9 are shorted together by a conductive (typically metal, e.g. aluminum) plate P to form the phase of the pair of MOSFETs. The gate G and drain D of the MOSFET 22 are coupled to conductive leads 40 and 42, respectively and the gate G and source S of the MOSFET 9 are coupled to conductive leads 44 and 46, respectively. The MOSFET power chip 38 is often enclosed within a package, as suggested by broken line 48.

As noted, FIG. 8 is just illustrative of an embodiment. MOSFET power chip 38 may, for example, include other circuitry within the package 48 which may or may not be interconnected with the MOSFETS 9 and/or 22. In this the example leads 40-46, are shown to extend out of the package 48 as external contacts. Alternatively, some or all of the leads can be internally connected within the package 48. Advantageously, the plate P can be used interconnects the two MOSFETs in a serial fashion to create the phase at plate P without requiring bonding wires.

Figure 9:
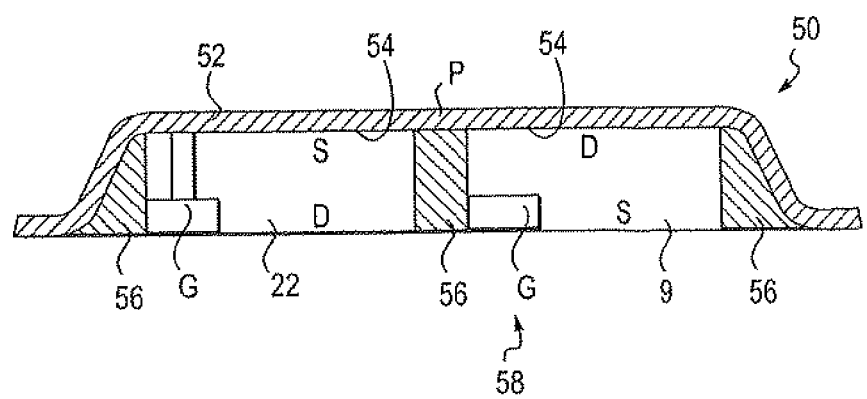
FIG. 9 is a partial cross-section of an example physical connection of a conventional vertical MOSFET with a MOSFET of FIG. 6 within a can-type package.

FIG. 9 illustrates an embodiment of a MOSFET power chip 50 by way of example and not limitation. The power chip 38 includes a conventional vertical MOSFET die 9 and a vertical MOSFET die 22 as described above, although they have been flipped with respect to the embodiment of FIG. 8. The source of MOSFET 22 and the drain of MOSFET 9 are shorted together by a conductive (typically metal) plate P which is part of a metal can package 52.

As noted, FIG. 9 is just illustrative of an embodiment. MOSFET power chip 50 may, for example, include other circuitry within the can package 52 which may or may not be interconnected with the MOSFETS 9 and/or 22. Advantageously, the plate P of can package 52 can be used interconnects the two MOSFETS in a serial fashion to create the phase without requiring bonding wires.

Standing et al. in U.S. Pat. Nos. 6,624,522, 6,930,397 and 7,285,866, incorporated herein by reference, teaches metal cans to serve as the package for a MOSFET. By way of example, a can package 52 may be made from a silver-plated copper alloy. It typically has internal dimensions that are greater than those of MOSFETS 9 and 22. The drain D of MOSFET 9 may be connected to the bottom of can 52 by a layer of silver-loaded conductive epoxy 54. Similarly, the source S of MOSFET 22 may be connected to the bottom of can 52 by the layer of silver-loaded conductive epoxy 54 by way of non-limiting example. A ring of low stress high adhesion epoxy 56 may be disposed around the edges of and between MOSFETs 9 and 22 to seal and add extra structural strength to the package 52 by way of non-limiting example. The gate G and drain D of MOSFET 22 and the gate G and source S of MOSFET 9 are exposed at the open end 58 of the can package 52 by way of non-limiting example. The pairing of a conventional MOSFET and a MOSFET with through-body via for its gate therefore allows a series connected pair of MOSFETS to be enclosed within a high-performance can package.

While example embodiments as described above are based upon MOSFET structures, it will be appreciated by those of skill in the art that other vertical devices can also be employed in example embodiments. For example, in certain embodiments vertical devices such as IGBT MOSFET, Vertical DMOS, Vertical JEFT GTO (gate turn-off thyristor) and MCT (MOS controlled thyristors) may be employed to make a vertical semiconductor switching device. Such embodiments may, by non-limiting example, include a semiconductor body having a first surface and a second surface and a vertical semiconductor structure formed therebetween, wherein a control gate for the vertical semiconductor structure would normally be associated with the first surface, and a via extending within the semiconductor body between the first surface and the second surface to associate the control gate with the second surface.

Although various embodiments have been described using specific terms and devices, such description is for illustrative purposes only. The words used are words of description rather than of limitation. It is to be understood that changes and variations may be made by those of ordinary skill in the art without departing from the spirit or the scope of the present invention, which is set forth in the following claims. In addition, it should be understood that aspects of various other embodiments may be interchanged either in whole or in part. It is therefore intended that the claims be interpreted in accordance with the true spirit and scope of the invention without limitation or estoppel.

What is claimed is:
1. A vertical MOSFET comprising:
a semiconductor body having a substantially planar first surface defining a source and a substantially planar second surface defining a drain, said first surface and said second surface being substantially parallel and not coplanar, wherein said source is electrically coupled to a source electrode associated with said first surface and said drain is electrically coupled to a drain electrode associated with said second surface:
a gate comprising a conductive material and an insulating layer which electrically isolates said conductive material from said body formed proximate said second surface; and
a via formed within said semiconductor body at least partially between said first surface and said second surface and coupled to said gate, wherein said via includes a conductive material and an insulating layer which electrically isolates the conductive material from said body;
wherein said vertical MOSFET comprises a plurality of MOSFET cells having their sources, drains, and gates electrically connected to said source, drain and gate, respectively, of said vertical MOSFET.

2. A vertical MOSFET as recited in claim 1 wherein said body comprises silicon.

3. A vertical MOSFET as recited in claim 2 wherein said silicon comprises at least a portion of a silicon wafer.

4. A MOSFET power chip comprising:
a first vertical MOSFET including a semiconductor body having a first surface defining a source and a second surface defining a drain, said source being electrically coupled to a source electrode associated with said first surface, said drain being electrically coupled to a drain electrode associated with said second surface, a gate structure formed in said semiconductor body proximate said second surface, and a via located within said semiconductor body which is substantially perpendicular to said first surface and said second surface, said via having a first end electrically coupled to said first surface and a second end electrically coupled to said gate structure, wherein said via includes a conductive material and an insulating layer which electrically isolates the conductive material from said body;
a second vertical MOSFET including a semiconductor body having a first surface defining a source and a second surface defining a drain, said source being electrically coupled to a source electrode associated with said first surface, said drain being electrically coupled to a drain electrode associated with said second surface and a gate structure formed in said semiconductor body proximate said first surface, said first surface of said first vertical MOSFET and said second surface of said second vertical MOSFET being substantially co-planar;
an electrically conductive plate coupling said source of said first vertical MOSFET to said drain of said second vertical MOSFET; and
an electrically conductive material coupling said first surface of said first vertical MOSFET to said second surface of said second vertical MOSFET.

5. A MOSFET power chip as recited in claim 4 wherein said bodies of said first vertical MOSFET and said second vertical MOSFET comprise silicon.

6. A MOSFET power chip as recited in claim 4 further comprising leads coupled to said gate and drain of said first vertical MOSFET and leads coupled to said gate and source of said second vertical MOSFET.

7. A MOSFET power chip as recited in claim 5 wherein said first vertical MOSFET and said second vertical MOSFET are disposed within a package.

8. A MOSFET power chip as recited in claim 7 wherein said package includes at least one of plastic, ceramic and metal.

9. A MOSFET power chip comprising:
a first vertical MOSFET including a semiconductor body having a first surface defining a source and a second surface defining a drain, said source being electrically coupled to a source electrode associated with said first surface, said drain being electrically coupled to a drain electrode associated with said second surface, a gate structure formed in said semiconductor body proximate said second surface, and a via located within said semiconductor body which is substantially perpendicular to said first surface and said second surface, said via having a first end electrically coupled to said first surface and a second end electrically coupled to said gate structure, wherein said via includes a conductive material and an insulating layer which electrically isolates the conductive material from said body;
a second vertical MOSFET including a semiconductor body having a first surface defining a source and a second surface defining a drain, said source being electrically coupled to a source electrode associated with said first surface, said drain being electrically coupled to a drain electrode associated with said second surface, and a gate structure formed in said semiconductor body proximate said first surface, said first surface of said first vertical MOSFET and said second surface of said second vertical MOSFET being substantially co-planar; and
an electrically conductive can substantially surrounding said first vertical MOSFET and said second vertical MOSFET and covering said first surface of said first vertical MOSFET to said second surface of said second vertical MOSFET
wherein said first surface of said first vertical MOSFET and said second surface of said second vertical MOSFET are electrically coupled to said can such that said source of said first vertical MOSFET is electrically coupled to said drain of said second vertical MOSFET.

10. A MOSFET power chip as recited in claim 9 wherein said first surface of said first vertical MOSFET and said second surface of said second vertical MOSFET are electrically coupled to said can by a conductive adhesive.

11. A MOSFET power chip as recited in claim 9 wherein said first surface of said first vertical MOSFET and said second surface of said second vertical MOSFET are electrically coupled to said can by a solder.

12. A MOSFET power chip as recited in claim 11 wherein said can comprises metal.

13. A power switching device comprising:
a substantially monocrystalline semiconductor body having a first surface and a second surface and a vertical semiconductor structure formed therebetween, said first surface being provided with a first control node; and
a via extending within said semiconductor body between said first surface and said second surface to provide a second control node for said second surface which is accessible from said first surface, wherein said via includes a conductive material and an insulating layer which electrically isolates the conductive material from said body;
wherein said power switching device is one of a MOSFET, IGBT MOSFET, Vertical DMOS, Vertical JEFT GTO and MCT device.

* * * * *